United States Patent
Park et al.

(10) Patent No.: US 7,355,357 B2
(45) Date of Patent: Apr. 8, 2008

(54) PLASMA ACCELERATOR

(75) Inventors: Won-taek Park, Seoul (KR); Vasily Pashkovski, Yongin-si (KR); Yuri Tolmachev, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 145 days.

(21) Appl. No.: 11/411,966

(22) Filed: Apr. 27, 2006

(65) Prior Publication Data

US 2007/0068457 A1    Mar. 29, 2007

(30) Foreign Application Priority Data

Sep. 27, 2005    (KR) .................. 10-2005-0090097

(51) Int. Cl.
*H05H 9/00* (2006.01)
(52) U.S. Cl. .................. 315/505; 315/506; 315/501
(58) Field of Classification Search ........... 315/501, 315/500, 502–504, 505, 506
See application file for complete search history.

(56) References Cited

U.S. PATENT DOCUMENTS 6,463,875 B1 * 10/2002 Chen et al. ............. 118/723 I

FOREIGN PATENT DOCUMENTS

| JP | 7-135096 | 5/1995 |
| JP | 7-245195 | 9/1995 |
| JP | 10-149898 | 6/1998 |
| JP | 11-121197 | 4/1999 |

* cited by examiner

*Primary Examiner*—Tuyet Vo
(74) *Attorney, Agent, or Firm*—Staas & Halsey LLP

(57) ABSTRACT

A plasma accelerator is provided. The plasma accelerator includes a chamber having a closed top, an opened bottom and a lateral surface, a first coil section comprising a plurality of coils that are connected to one another in series and are wound around the lateral surface of the chamber in opposite directions, and a second coil section comprising a plurality of coils that are wound around the lateral surface of the chamber between coils of the first coil section in opposite directions. Accordingly, it is possible to make the mutual inductance between the coils small, to accurately adjust levels and phase differences of currents to be applied to the coils, and also to simplify the driving circuit.

14 Claims, 7 Drawing Sheets

PLASMA ACCELERATOR

CROSS-REFERENCE TO RELATED APPLICATIONS

This application claims the benefit of Korean Patent Application No. 10-2005-0090097, filed on Sep. 27, 2005, in the Korean Intellectual Property Office, the disclosure of which is incorporated herein by reference.

BACKGROUND OF THE INVENTION

1. Field of the Invention

The present invention relates to a plasma accelerator, and more particularly, to a plasma accelerator which winds driving coils in opposite directions and connects the driving coils with one another, thereby reducing a mutual inductance between the driving coils and accurately adjusting levels and phase differences of currents applied to the driving coils, and also simplifies a driving circuit.

2. Description of the Related Art

A plasma accelerator accelerates flux of plasma generated or existing in a specific space using electric energy and magnetic energy and is called an 'electro-magnetic accelerator' (EMA).

The plasma accelerator has been developed for a rocket engine for space travel and is recently used in etching a wafer in the process of manufacturing a semiconductor.

Figure 1:
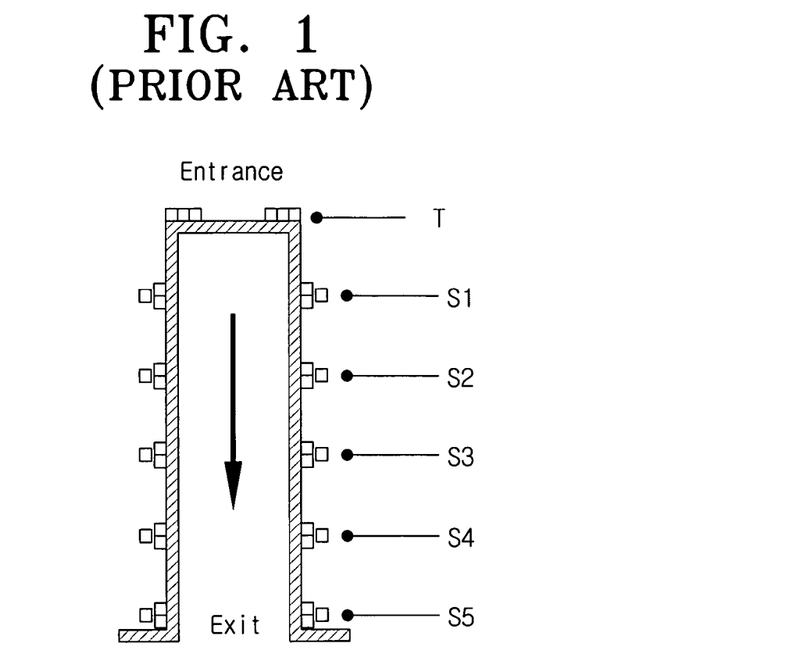
FIG. 1 is a cross section view illustrating a conventional plasma accelerator.

FIG. 1 is a cross section view illustrating a conventional plasma accelerator.

As shown in FIG. 1, the conventional plasma accelerator is in the shape of a cylinder and has a top coil T wound around an entrance, which is an upper portion of the plasma accelerator. A first coil S1, a second coil S2, a third coil S3, a fourth coil S4, and a fifth coil S5 are wound around from the entrance to an exit in sequence. The coils T, S1, S2, S3, S4 and S5 are not connected to one another and are wound independently.

Accordingly, individual currents are applied to the coils T, S1, S2, S3, S4 and S5. Plasma is generated in the plasma accelerator by applying RF currents to the coils T, S1, S2, S3, S4 and S5. The currents flowing through the coils T, S1, S2, S3, S3 and S5 generate a magnetic field in the plasma accelerator.

The magnetic field generated in the plasma accelerator by the currents flowing through the coils T, S1, S2, S3, S4, and S5 induces a second current according to Maxwell induction equation, and the second current converts gas in the plasma accelerator into plasma.

According to a plasma acceleration method of the conventional plasma accelerator, a current of 40A is applied to the first coil S1, the third coil S3 and the fifth coil S5, and a current having a phase difference of 90° is applied to the top coil T, the second coil S2 and the fourth coil S4. (A refers to Amperes.) The magnetic field is generated by the currents and accelerates the plasma toward the exit.

Figure 2:
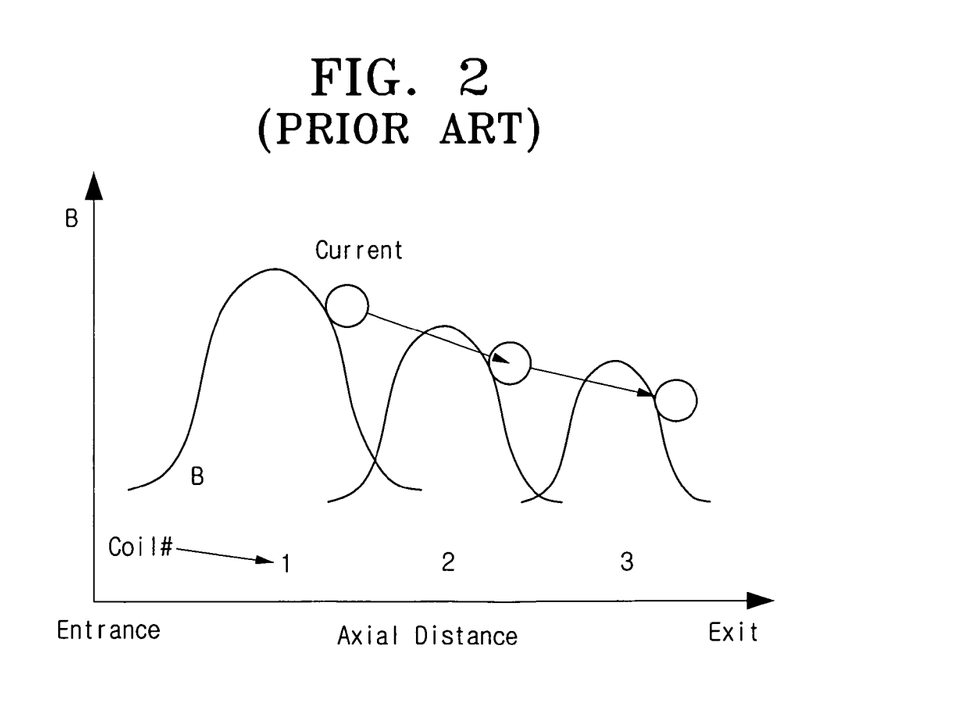
FIG. 2 is a graph showing a magnitude of magnetic field in the plasma accelerator of FIG. 1.

FIG. 2 is a graph illustrating a magnitude of magnetic field generated in the plasma accelerator of FIG. 1.

In FIG. 2, the horizontal axis indicates a vertical distance from the entrance of the plasma accelerator to the exit, and the vertical axis indicates a magnitude of magnetic field generated in the plasma accelerator for a specific time.

The circles indicate the second current that is induced by the magnetic field generated in the plasma accelerator, and the arrow indicates a direction in which the plasma is accelerated.

A magnetic pressure distribution is $B^2/2\mu$. Herein, B denotes a magnetic flux density and $\mu$ denotes a permeability. At the first time, the current of 40A, which is the maximum AC current (alternating current), is applied to the top coil T, the second coil S2, and the fourth coil S4, and the current having a phase difference of 90° is applied to the first coil S1 and the third coil S3. That is, the current of 0A is applied to the first coil S1 and the second coil S3. Then, a magnetic pressure is distributed in the plasma accelerator.

Next, a current of 30A is applied to the top coil T, the second coil S2 and the fourth coil S4, and a current having a phase of 90° is applied to the first coil S1 and the third coil S3. Then, the magnetic pressure moves toward the exit.

Next, a current of 10A is applied to the top coil T, the second coil S2 and the fourth coil S4, and a current having a phase difference of 90° is applied to the first coil S1 and the third coil S3. Then, the magnetic pressure further moves toward the exit.

Next, a current of 0A is applied to the top coil T, the second coil S2 and the fourth coil S4, and a current having a phase difference of 90° is applied to the first coil S3 and the third coils S3. Then, the magnetic pressure further moves toward the exit.

As described above, the magnetic pressure distribution progressively changes toward the exit as the time elapses. Due to the change in the magnetic pressure distribution, the plasma moves toward the exit. In order to be moved by the magnetic pressure, the plasma has to be ahead of a magnetic pressure pulse. This is because the gradient of the magnetic pressure creates a magnetic pressure force and has the plasma flow toward the exit.

If the magnetic pressure force is so weak that the plasma is slow, the plasma does not follow the change of the magnetic pressure distribution. Therefore, the plasma accelerator cannot accelerate the plasma. In this case, reducing a gap between coils and lowering a frequency of driving current makes the motion of the magnetic pressure distribution slow.

The following table 1 is a matrix that shows a self-inductance and a mutual inductance of the coils in rows and columns. Since the distribution of the inductance values is diagonally symmetrical, the repeated inductance values are omitted. The inductance value is expressed in the unit of $\mu H$ (microhenries).

TABLE 1

|    | T     | S1    | S2    | S3    | S4    | S5    |
|----|-------|-------|-------|-------|-------|-------|
| T  | 0.393 | 0.092 | 0.023 | 0.007 | 0.001 | 0.000 |
| S1 |       | 1.060 | 0.219 | 0.060 | 0.019 | 0.004 |
| S2 |       |       | 1.060 | 0.219 | 0.060 | 0.019 |
| S3 |       |       |       | 1.060 | 0.219 | 0.060 |
| S4 |       |       |       |       | 1.060 | 0.219 |
| S5 |       |       |       |       |       | 1.060 |

A total of 6 coils T1, S1, S2, S3, S4, S5 are applied with individual currents from 6 divided RF generators.

A magnetic energy W stored in the coil is calculated according to the following equation 1:

$$W = \frac{L_1 I_1^2}{2} + \frac{L_2 I_2^2}{2} + M_{12} I_1 I_2$$

wherein $I_1$ denotes a current flowing through the first coil, $I_2$ denotes a current flowing through the second coil, $L_1$ denotes a self-inductance of the first coil, $L_2$ denotes a self-inductance of the second coil, and $M_{12}$ denotes a mutual inductance If the current $I_1$ is set to 0 and the current $I_2$ is set to 1, a magnetic energy W is calculated and thus $L_1$, $L_2$, and $M_{12}$ can be obtained. Accordingly, each element of the matrix of the table 1 can be calculated.

However, the mutual inductances of the coils T, S1, S2, S3, S4 and S5 have considerable magnitudes. Due to the mutual inductances, the current is likely to be unstably applied to the coils. The unstable level of current and the unstable phase difference cause an unstable operation of the plasma accelerator.

SUMMARY OF THE INVENTION

Additional aspects, features and/or advantages of the present invention will be set forth in part in the description which follows and, in part, will be apparent from the description, or may be learned by practice of the invention.

The present invention provides a plasma accelerator to reduce a mutual inductance between driving coils by winding the driving coils in opposite directions and connecting the driving coils to one another, to accurately adjust a level and a phase difference of currents to be applied to the coils, and to simplify a driving circuit.

An aspect of the present invention provides a plasma accelerator comprising a chamber having a closed top, an opened bottom and a lateral surface, a first coil section comprising a plurality of coils that are connected to one another in series and are wound around the lateral surface of the chamber in opposite directions, and a second coil section comprising a plurality of coils that are wound around the lateral surface of the chamber between coils of the first coil section in opposite directions.

The chamber may be a cylindrical cylinder.

The chamber may be made of a dielectric substance.

In another aspect of the present invention, the first coil section may comprise a top coil that turns around a center axis of the chamber on the top of the chamber in one direction, getting progressively farther from the center axis, a first coil that is wound around the lateral surface of the chamber in an opposite direction to the direction in which the top coil is wound, and a second coil that is wound around the lateral surface of the chamber away from the first coil by a predetermined distance in an opposite direction to the direction in which the first coil is wound.

In another aspect of the present invention, one end of the top coil may be a first input terminal, the other end of the top coil may be connected to one end of the first coil, the other end of the first coil may be connected to one end of the second coil, and the other end of the second coil may be a first output terminal.

In another aspect of the present invention, the second coil section may comprise a third coil that is wound around the lateral surface of the chamber between the top coil and the first coil in the same direction as the direction in which the top coil is wound, a fourth coil that is wound around the lateral surface of the chamber between the first coil and the second coil in an opposite direction to the direction in which the third coil is wound, and a fifth coil that is wound around the lateral surface of the chamber below the second coil by a predetermined distance in an opposite direction to the direction in which the fourth coil is wound.

In another aspect of the present invention, one end of the third coil may be a second input terminal, the other end of the third coil may be connected to one end of the fourth coil, the other end of the fourth coil may be connected to one end of the fifth coil, and the other end of the fifth coil may be a second output terminal.

In another aspect of the present invention, currents applied to the first coil section and the second coil section may have a phase differential of 90° therebetween.

Another aspect of the present invention provides a wafer etching device using a plasma accelerator to etch a wafer for a semiconductor, the plasma accelerator comprising a chamber having a closed top, an opened bottom and a lateral surface, a first coil section comprising a plurality of coils that are connected to one another in series and are wound around the lateral surface of the chamber in opposite directions, and a second coil section comprising a plurality of coils that are wound around the lateral surface of the chamber between coils of the first coil section in opposite directions.

In another aspect, the present invention provides a plasma accelerator comprising a first coil section comprising a plurality of coils that are connected to one another in series and wound in opposite directions; and a second coil section comprising another plurality of coils that are connected to one another in series and positioned between coils of the first coil section and after an end of the first coil section.

In another aspect of the present invention, the plasma accelerator may further comprise a chamber having a closed end, an open end and a lateral surface, wherein one of the plurality of coils of the first coil section may be wound around the closed end of the chamber.

In another aspect of the present invention, the other coils of the plurality coils of the first coil section may be wound around the lateral surface of the chamber.

In another aspect of the present invention, the coils of the second coil section may be wound around the lateral surface of the chamber.

In another aspect of the present invention, currents applied to the first coil section and the second coil section may have a phase differential of 90° therebetween.

BRIEF DESCRIPTION OF THE DRAWINGS

These and/or other aspects, features, and advantages of the present invention will become apparent and more readily appreciated from the following description of exemplary embodiments, taken in conjunction with the accompanying drawings of which.

DETAILED DESCRIPTION OF THE PREFERRED EMBODIMENTS

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 3:
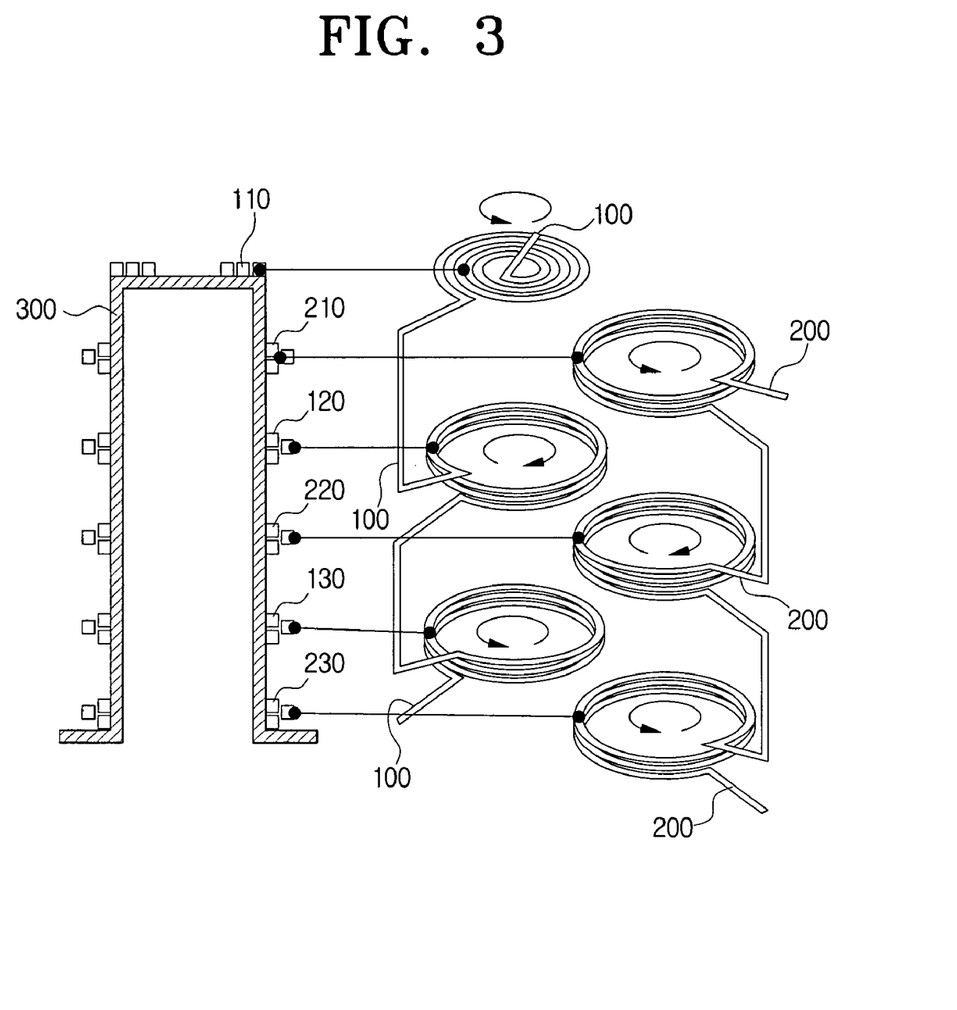
FIG. 3 is a view illustrating a cross section of a plasma accelerator and a connection structure of coils according to an exemplary embodiment of the present invention.

FIG. 3 illustrates a cross section of a plasma accelerator and a connection structure of coils according to an exemplary embodiment of the present invention.

Referring to FIG. 3, the plasma accelerator according to an exemplary embodiment of the present invention comprises a first coil section 100, a second coil section 200, and a chamber 300. The first coil section 100 comprises a top coil 110, a first coil 120 and a second coil 130. The second coil section 200 comprises a third coil 210, a fourth coil 220 and a fifth coil 230. The coils are wound in the directions of arrows. Although six coils (top coil through fifth coil) are discussed in this example, additional coils may be added to each coil section consistent with the principles and spirit of exemplary embodiments.

The chamber 300 has a closed top, an opened bottom, and a lateral surface. The chamber may be in the form of a cylinder and may be made of a dielectric substance having a predetermined thickness.

The first coil section 100 comprises the plurality of coils 110, 120, 130. The coils 110, 120, 130 are connected to one another in series and are wound around the lateral surface of the chamber 300 in opposite directions.

The second coil section 200 comprises the plurality of coils 210, 220, 230. The coils 110, 120, 130 and the coils 210, 220, 230 are alternately arranged. The coils 210, 220, 230 are connected to one another in series and are wound around the lateral surface of the chamber 300 in opposite directions.

The top coil 110 is wound on the top of the chamber 300 by turning in either counterclockwise or clockwise direction around a center axis of the chamber, drawing a circle a diameter of which gradually increases from the center axis. The top coil 110 begins with an input terminal and ends with an output terminal.

The first coil 120 is wound around the lateral surface of the chamber 300 in the opposite direction to the direction in which the top coil 110 is wound. The first coil 120 has an input terminal connected to the output terminal of the top coil 110. The first coil 120 ends with an output terminal.

The second coil 130 is wound around the lateral surface of the chamber 300 in the opposite direction to the direction in which the first coil 120 is wound. The second coil 130 has an input terminal connected to the output terminal of the first coil 120 and ends with an output terminal.

The third coil 210 is wound around the lateral surface of the chamber 300 between the top coil 110 and the first coil 120 in the same direction as the direction in which the top coil 110 is wound. The third coil 210 begins with an input terminal and ends with an output terminal.

The fourth coil 220 is wound around the lateral surface of the chamber 300 between the first coil 120 and the second coil 130 in the opposite direction to the direction in which the third coil 210 is wound. The fourth coil 220 has an input terminal connected to the output terminal of the third coil 210 and ends with an output terminal.

The fifth coil 230 is wound around the lateral surface of the chamber 300 below the fourth coil 220 in the opposite direction to the direction in which the fourth coil 220 is wound. The fifth coil 230 has an input terminal connected to the output terminal of the fourth coil 220 and ends with an output terminal.

Figure 4:
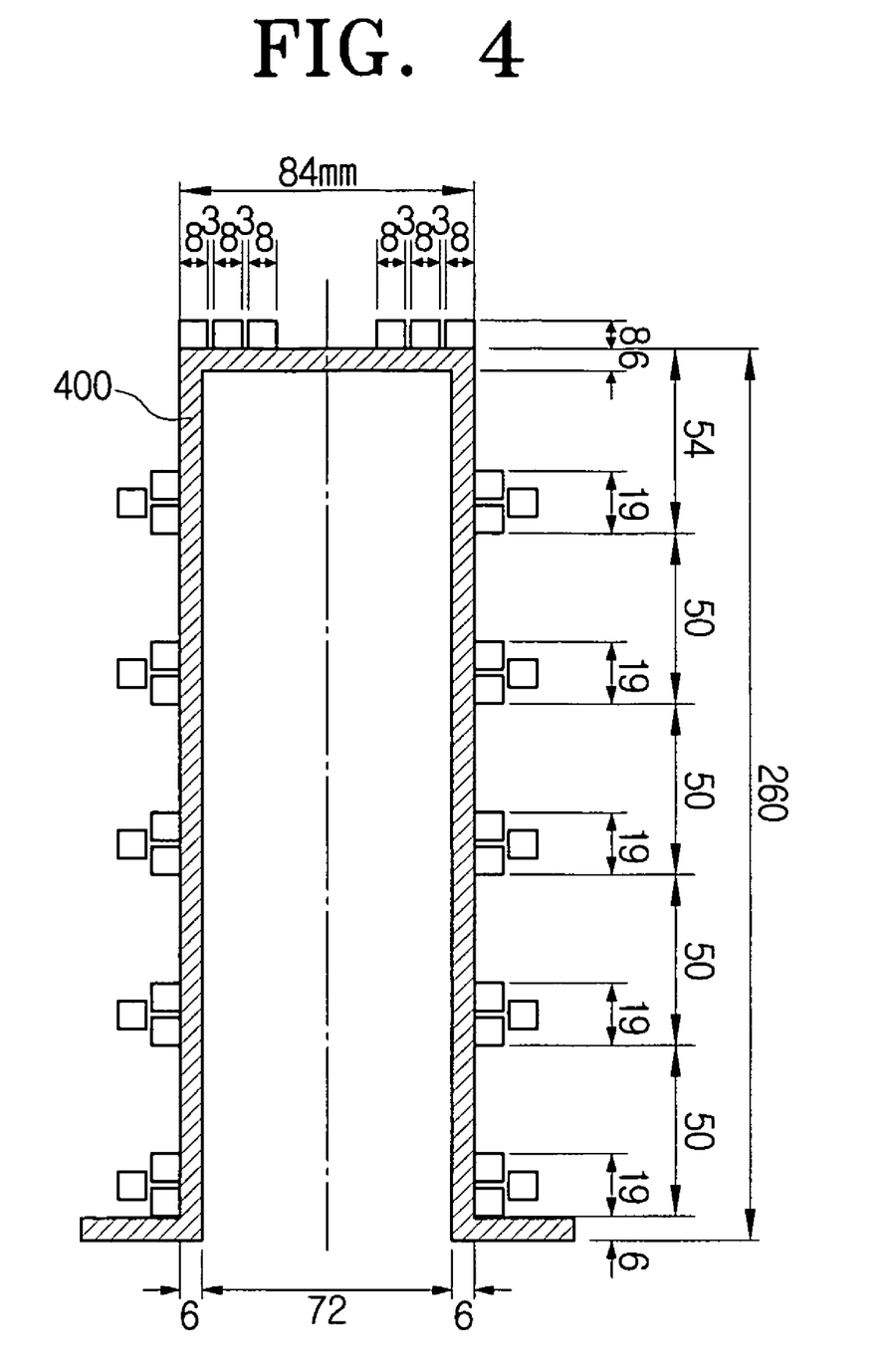
FIG. 4 is a cross section view illustrating the sizes of the plasma accelerator according to an exemplary embodiment present invention.

FIG. 4 is a view illustrating examples of sizes of the plasma accelerator according to an exemplary embodiment of the present invention.

As shown in FIG. 4, a cylinder 400 of the plasma accelerator has a thickness of 6 mm, a diameter of 72 mm (a radius of 36 mm), and a height of 260 mm. The coil is a square coil with equal sides of 8 mm and the coils are separated by 3 mm. The thickness, diameter and height of the cylinder are only exemplary and other thicknesses, diameters, and heights may be used to implement the present invention. In addition, the thickness or other dimensions of the coils and the distance between the coils are only exemplary and other thicknesses or dimensions of coils and other distances between the coils may be used to implement the present invention. Accordingly, the above measurements are used as an example to convey a few of the principles and spirit of exemplary embodiments.

Figure 5A:
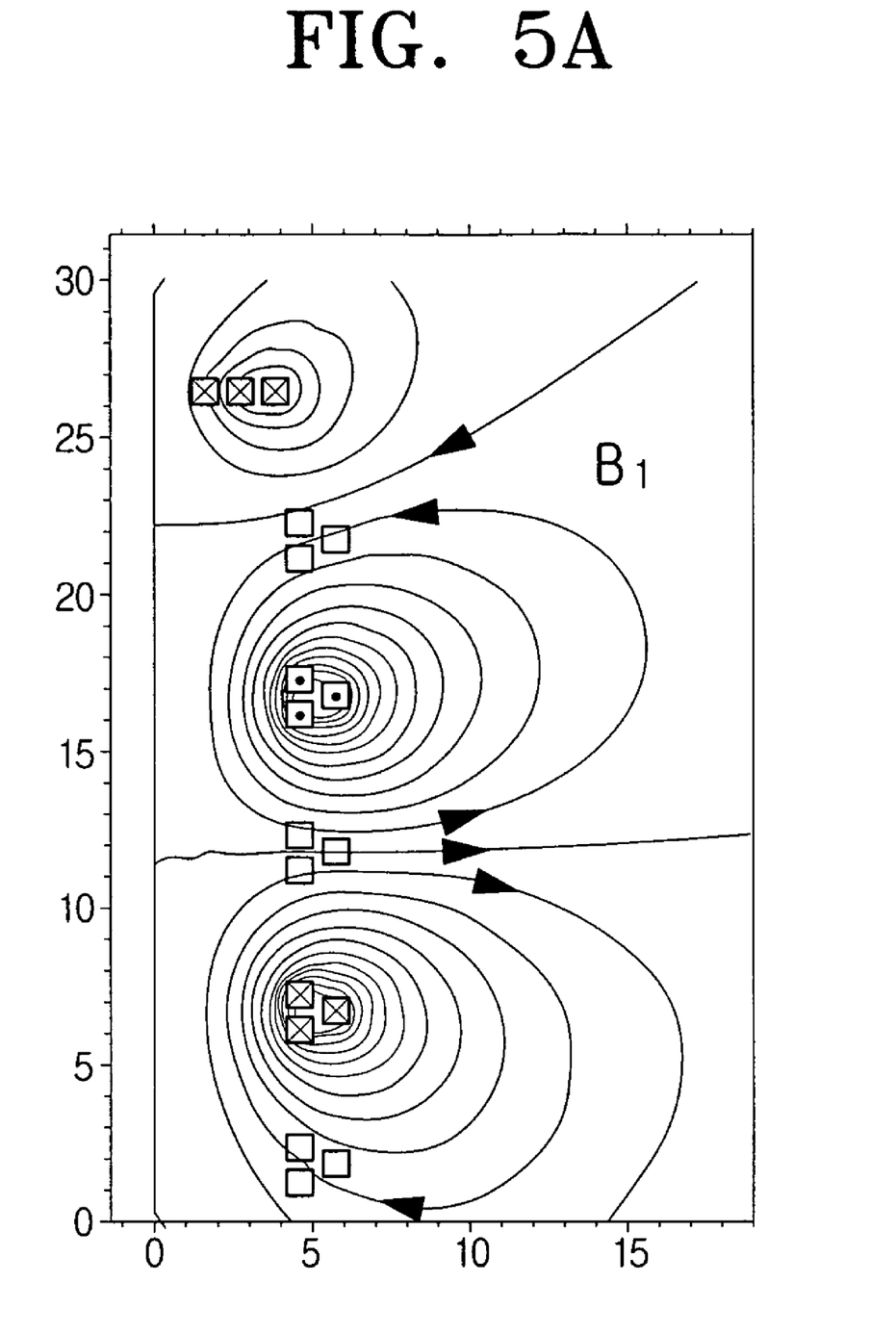
FIG. 5A is a view illustrating a magnetic field $B_1$ generated when a current is applied to a first coil section 100 of FIG. 3.
Figure 5B:
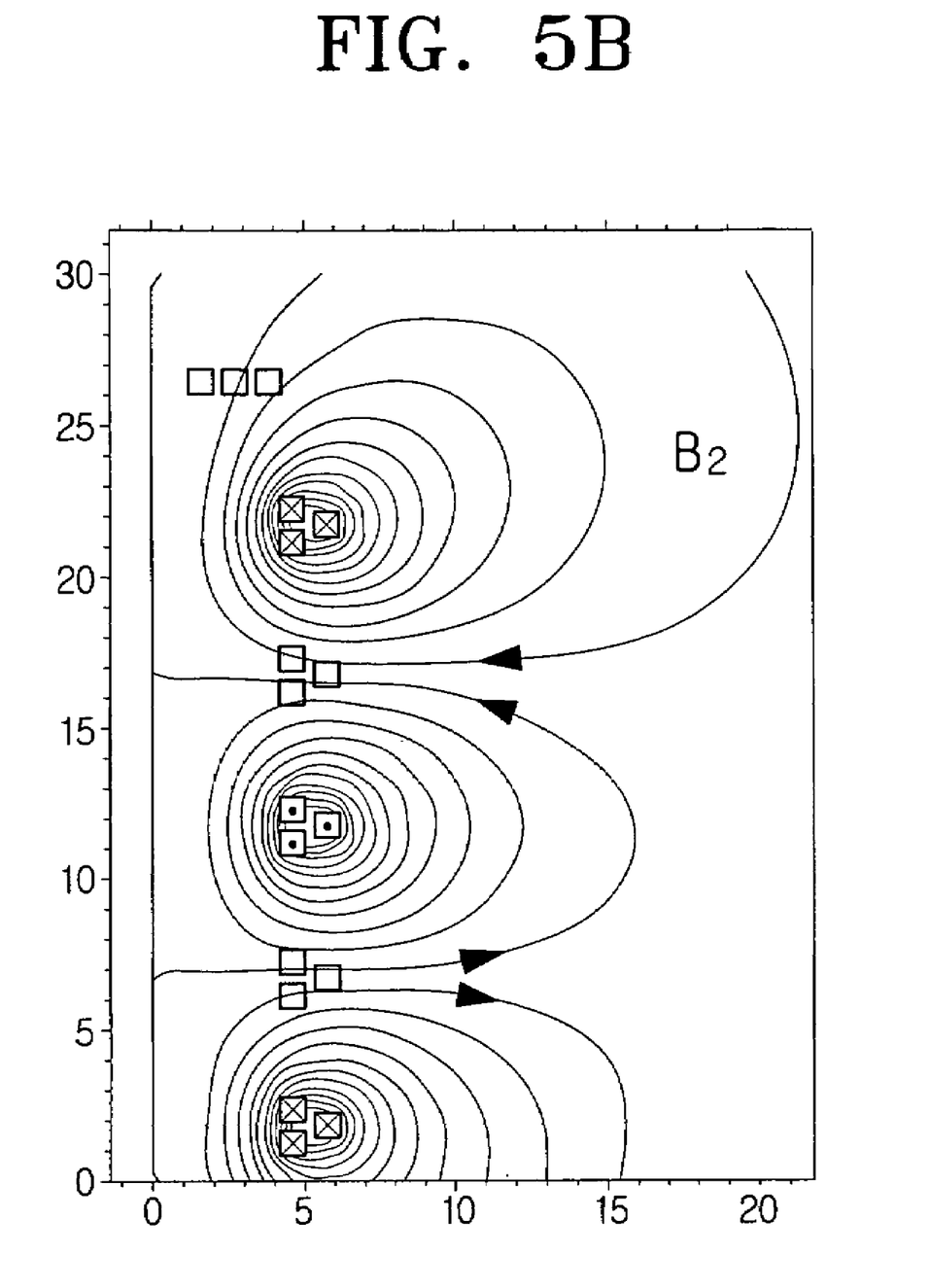
FIG. 5B is a view illustrating a magnetic field $B_2$ generated when a current is applied to a second coil section 200 of FIG. 3.
Figure 5C:
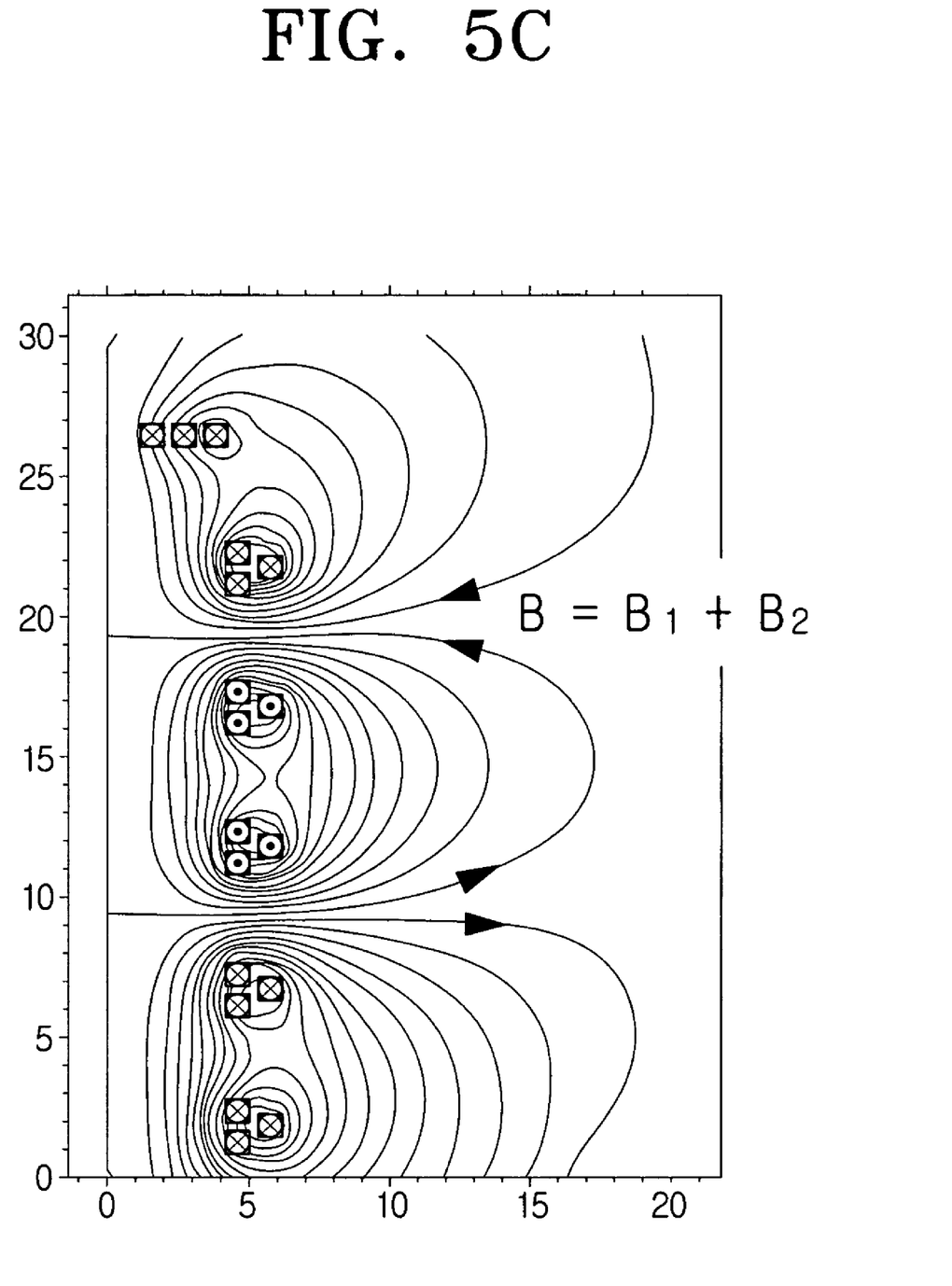
FIG. 5C is a view illustrating a magnetic field B generated when a current is applied to the first coil section 100 and the second coil section 200 of FIG. 3.

FIG. 5A is a view illustrating a magnetic field B1 generated if a current is applied to the first coil section 100, FIG. 5B is a view illustrating a magnetic field B2 generated if a current is applied to the second coil section 200, and FIG. 5C is a view illustrating a magnetic field B generated if a current is applied to the first coil section 100 and the second coil section 200.

As shown in FIGS. 5A to 5C, if a current is applied to the first coil section 100, the magnetic field B1 is generated, and if a current having a phase difference of 90 with respect to the current applied to the first coil section 100 is applied to the second coil section 200, the magnetic field B2 is generated. As a result, a composition magnetic field B of the B1 and the B2 is generated.

Subsequently, magnetic fluxes are weakly connected and mutual inductances between two coils are small. The symmetrical arrangements of coils and alternate current change cause the mutual inductances between two coils to be small.

Figure 6:
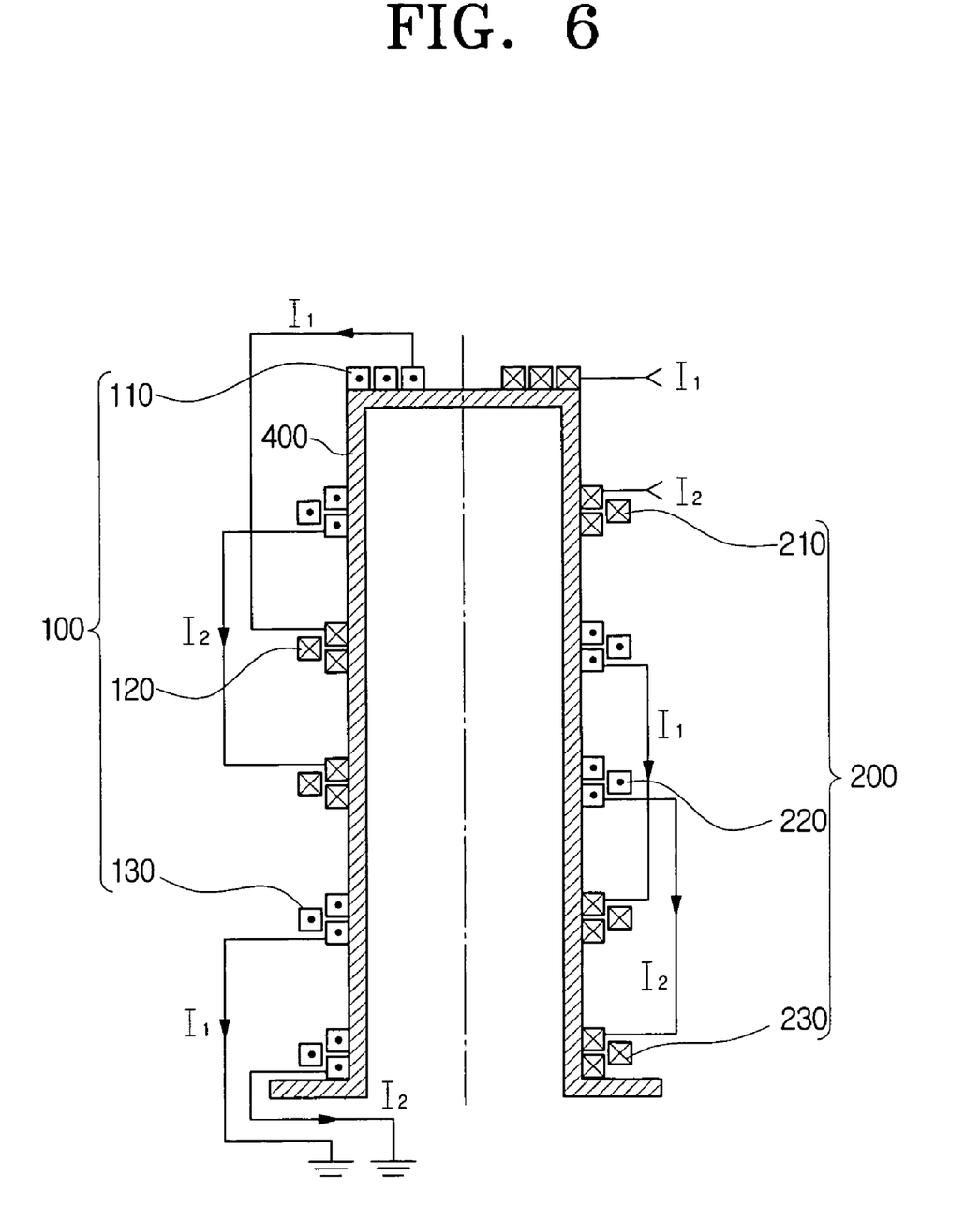
FIG. 6 is a cross section view illustrating the plasma accelerator of FIG. 3.

FIG. 6 is a cross section view of the plasma accelerator of FIG. 3.

As shown in FIG. 6, the plasma accelerator according to an exemplary embodiment of the present invention comprises the first coil section 100 and the second coil section 200. A first current $I_1$ is applied to the first coil section 100 and a second current $I_2$ having a phase difference of 90° with respect to the first current $I_1$ is applied to the second coil section 200.

The first current $I_1$ flows in through the input terminal of the top coil 110, passes through the first coil 120 and the second coil 130, and finally flows to the ground.

The second current $I_2$ flows in through the input terminal of the third coil 210, passes through the fourth coil 220 and the fifth coil 230 and finally flows to the ground.

The self-inductance $L_1$ of the first coil section 100 is calculated as 2.34 $\mu H$ and the self-inductance $L_2$ of the second coil section 200 is calculated as 2.94 $\mu H$.

The mutual inductance $M_{12}$ between the first coil section 100 and the second coil section 200 is calculated as 0.082 $\mu H$ which corresponds to a coupling of 3% between the first current $I_1$ and the second current $I_2$. The level of coupling is too small to affect a driving circuit of the plasma accelerator. That is, the plasma accelerator according to the present invention makes the mutual inductance small. Accordingly, the plasma accelerator according to an exemplary embodiment of the present invention facilitates a process of etching a wafer for a semiconductor.

As described above, it is possible to make the mutual inductance between the coils small by winding the coils in the opposite directions and connecting the coils to one another. Accordingly, it is possible to accurately adjust levels and phase differences of currents to be applied to the coils and also to simplify the driving circuit. Also, since only the two power supplies are used for the two coils, the number of drawn lines is reduced.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. A plasma accelerator comprising:
   a chamber having a closed top, an opened bottom and a lateral surface;
   a first coil section comprising a plurality of coils that are connected to one another in series and are wound around the lateral surface of the chamber in opposite directions; and
   a second coil section comprising a plurality of coils that are wound around the lateral surface of the chamber between coils of the first coil section in opposite directions.

2. The plasma accelerator as claimed in claim 1, wherein currents applied to the first coil section and the second coil section have a phase differential of 90° therebetween.

3. The plasma accelerator as claimed in claim 1, wherein the chamber is a cylindrical cylinder.

4. The plasma accelerator as claimed in claim 3, wherein the chamber is made of a dielectric substance.

5. The plasma accelerator as claimed in claim 1, wherein the first coil section comprises:
   a top coil that turns around a center axis of the chamber on the top of the chamber in one direction;
   a first coil that is wound around the lateral surface of the chamber in an opposite direction to the direction in which the top coil is wound; and
   a second coil that is wound around the lateral surface of the chamber away from the first coil by a predetermined distance in an opposite direction to the direction in which the first coil is wound.

6. The plasma accelerator as claimed in claim 5, wherein one end of the top coil is a first input terminal, the other end of the top coil is connected to one end of the first coil, the other end of the first coil is connected to one end of the second coil, and the other end of the second coil is a first output terminal.

7. The plasma accelerator as claimed in claim 6, wherein the second coil section comprises:
   a third coil that is wound around the lateral surface of the chamber between the top coil and the first coil in the same direction as the direction in which the top coil is wound;
   a fourth coil that is wound around the lateral surface of the chamber between the first coil and the second coil in an opposite direction to the direction in which the third coil is wound; and
   a fifth coil that is wound around the lateral surface of the chamber below the second coil by a predetermined distance in an opposite direction to the direction in which the fourth coil is wound.

8. The plasma accelerator as claimed in claim 7, wherein one end of the third coil is a second input terminal, the other end of the third coil is connected to one end of the fourth coil, the other end of the fourth coil is connected to one end of the fifth coil, and the other end of the fifth coil is a second output terminal.

9. A wafer etching device using a plasma accelerator to etch a wafer for a semiconductor, the plasma accelerator comprising:
   a chamber having a closed top, an opened bottom and a lateral surface;
   a first coil section comprising a plurality of coils that are connected to one another in series and are wound around the lateral surface of the chamber in opposite directions; and
   a second coil section comprising a plurality of coils that are wound around the lateral surface of the chamber between coils of the first coil section in opposite directions.

10. A plasma accelerator comprising:
    a first coil section comprising a plurality of coils that are connected to one another in series and wound in opposite directions; and
    a second coil section comprising another plurality of coils that are connected to one another in series and positioned between coils of the first coil section and after an end of the first coil section.

11. The plasma accelerator as claimed in claim 10, wherein the coils of the second coil section are wound around the lateral surface of the chamber.

12. The plasma accelerator as claimed in claim 10, wherein currents applied to the first coil section and the second coil section have a phase differential of 90° therebetween.

13. The plasma accelerator as claimed in claim 10, further comprising a chamber having a closed end, an open end and a lateral surface, wherein one of the plurality of coils of the first coil section is wound around the closed end of the chamber.

14. The plasma accelerator as claimed in claim 13, wherein the other coils of the plurality coils of the first coil section are wound around the lateral surface of the chamber.

* * * * *